United States Patent [19]

Hosticka et al.

[11] Patent Number: 4,959,621
[45] Date of Patent: Sep. 25, 1990

[54] DIFFERENTIAL AMPLIFIER HAVING EXTERNALLY CONTROLLABLE POWER CONSUMPTION

[75] Inventors: Bedrich Hosticka, Duisburg; Roland Klinke, Dortmund; Hans-Joerg Pfleiderer, Zorneding, all of Fed. Rep. of Germany

[73] Assignee: Siemens Aktiengesellschaft, Berlin and Munich, Fed. Rep. of Germany

[21] Appl. No.: 367,319

[22] Filed: Jun. 16, 1989

[30] Foreign Application Priority Data

Jul. 21, 1988 [DE] Fed. Rep. of Germany ....... 3824830

[51] Int. Cl.$^5$ .............................................. H03F 3/45
[52] U.S. Cl. .................................... 330/253; 330/258; 330/261
[58] Field of Search .......................... 330/253, 258, 261

[56] References Cited

U.S. PATENT DOCUMENTS 4,780,688 10/1988 Groom ................................ 330/261
4,843,341 6/1989 Hosticka et al. ................. 330/261 X

OTHER PUBLICATIONS

"Design of MOS VLSI Circuits for Telecommunications" by Tsividis et al., Prentice-Hall, Inc., New Jersey, 1985, pp. 129-136.

Primary Examiner—James B. Mullins
Attorney, Agent, or Firm—Hill, Van Santen, Steadman & Simpson

[57] ABSTRACT

A differential amplifier having externally controllable power consumption. The differential amplifier has an external circuit stage for signal-dependent setting of the power consumption. The circuit stage is composed of two field effect transistors connected parallel to one another that are arranged in series with a resistor of the output side via which the current source of the differential amplifier is set. The field effect transistors are driven by a level-converting circuit proceeding from the amplifier input, this level-converting circuit being equipped with a control circuit. The control circuit defines the operating points of the field effect transistors with and without applied input signal and thus controls the signal-dependent boosting of the amplifier current.

10 Claims, 1 Drawing Sheet

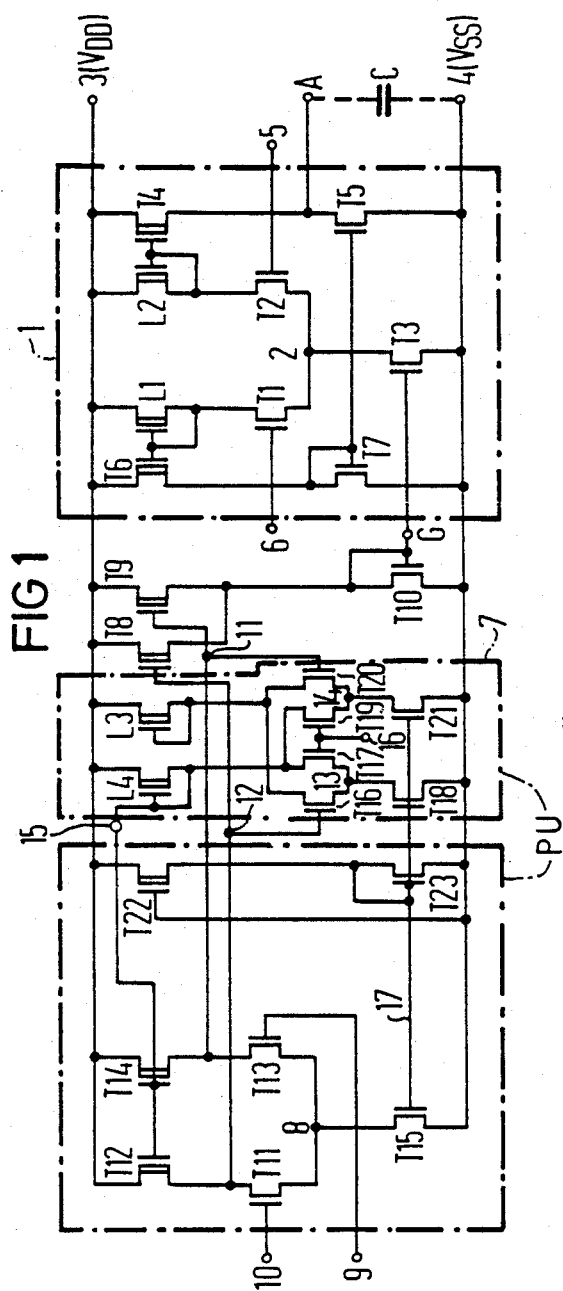
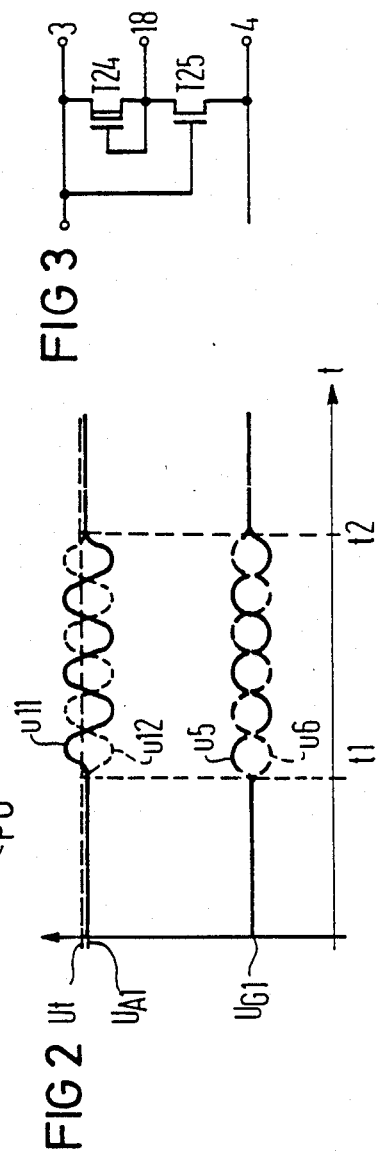

DIFFERENTIAL AMPLIFIER HAVING EXTERNALLY CONTROLLABLE POWER CONSUMPTION

BACKGROUND OF THE INVENTION

The present invention is directed to differential amplifier.

A prior art differential amplifier is disclosed in the book "Design of MOS VLSI Circuits for Telecommunications" by Y. Tsividis and P. Antognetti, Prentice Hall, New Jersey (1985), pages 129 through 136, particularly FIG. 5.4. Therein, two additional field effect transistors connected in parallel to a power source and serving as controllable power sources are affected by current-mirroring circuits and by the currents flowing in the parallel circuit branches such that the one additional field effect transistor supplies an auxiliary current that intensifies the quiescent current of the power source when a fixed voltage value is exceeded by an input signal superimposed on a gate bias. The other, additional field effect transistor supplies an auxiliary current that intensifies the quiescent current of the power source when the fixed voltage value is downwardly transgressed by the superimposed input signal. The current-mirroring circuits are structured such that the low quiescent current is greatly intensified by the signal-dependent appearance of the auxiliary currents. Good driver properties for simultaneous reduction of the dissipated power of the differential amplifier are thus achieved.

One disadvantage of this known amplifier, however, is that instabilities that very frequently lead to a distortion of the output signal appear in the control circuits formed by the parallel circuit branches, the current-mirroring circuits and the controllable power sources. These instabilities appear particularly for supply of an input signal having steeply ascending and descending signal edges, for example a square wave voltage.

An earlier German Patent Application No. P 37 01 791.8 discloses a differential amplifier wherein two field effect transistors connected parallel to the power source and serving as controllable power sources are driven from the circuit input via a level-converting circuit such that the low quiescent current is greatly intensified by an appearance of the auxiliary currents dependent on the input signal. Compared to the former, known differential amplifier, the critical advantage herein is that no control of the additional power sources occurs from the amplifier output side. Rather, a control thereof occurs from the amplifier input side, so that no significant distortions of the output signal appear even for square wave voltages to be transmitted.

SUMMARY OF THE INVENTION

An object of the present invention is to provide a differential amplifier that exhibits good driver properties with low dissipated power due to a signal-dependent boosting of its low quiescent current and wherein a simple generation of the auxiliary, signal, dependent current components superimposed on the quiescent current occurs in comparison to prior art differential amplifiers.

The present invention involves a differential amplifier having first and second parallel circuit branches each of which contains a load element and a field effect transistor, respectively, and having a field effect transistor serving as a current source that is connected to both parallel circuit branches via a first circuit node and whose gate terminal is connected to a bias that defines the quiescent currents flowing in these circuit branches. The present invention has a circuit stage for setting the quiescent currents that is composed of two field effect transistors that are connected in parallel and that are connected in series with a resistor of the output side. The resistor of the output side is connected to a gate terminal of the field effect transistor that serves as current source. A level-converting circuit has an input side connected to gate terminals of the field effect transistors in the parallel circuit branches, that, further, converts the DC part of the input signal to a higher output level that falls slightly below the value of the threshold voltage of the two field effect transistors that are connected parallel to one another, and that has its output side connected to gate terminals of the two field effect transistors. The level-converting circuit having a common-mode control circuit to which a reference voltage corresponding to the output level is supplied as a controlled variable.

The output-side resistor of the circuit stage for setting the quiescent currents is composed of a field effect transistor having a gate terminal connected to its drain terminal as well as to the gate terminal of the field effect transistor that serves as the current source.

The level-converting circuit is composed of a differential amplifier stage that contains two current branches connected parallel to one another, each of the current branches having a series circuit of two field effect transistors, respectively, of different channel types. A first current source transistor of one channel type is connected to these two current branches via the second circuit node. Gate terminals of the field effect transistors in the current branches that correspond to the channel type of the first current source transistor form the circuit inputs of the level-converting circuit. The junctions between the latter field effect transistors and the other two field effect transistors in the current branches represent the circuit outputs of the level-converting circuit. Both these other two field effect transistors as well as the current source transistor are operated in a saturation range.

The common-mode control circuit is composed of first and second cross-coupled differential amplifier stages. The first cross-coupled differential amplifier stage has two circuit branches connected parallel to one another, whereof the first has a series circuit of a field effect transistor of a first channel type that is connected as a load element and a field effect transistor of a second channel type. The second has a series circuit of a further field effect transistor of the first channel type connected as a load element and a further field effect transistor of the second channel type. These two circuit branches are connected to a second current source transistor via a third circuit node. The second of the cross-coupled differential amplifier stages likewise has two circuit branches connected parallel to one another, whereby the first thereof has a series circuit of an additional field effect transistor of the second channel type and the field effect transistor connected as the load element in the second circuit branch of the first cross-coupled differential amplifier stage and the second circuit branch of the second cross-coupled differential amplifier stage contains the series circuit of a further, additional field effect transistor of the second channel type and the field effect transistor connected as the load element in the first circuit branch of the first cross-coupled differential amplifier stage. The circuit branches of the second cross-coupled amplifier stage are connected to a third current source transistor via a third circuit node. The outputs of the level-converting circuit are connected to gate terminals of the field effect transistors of the second channel type in the first circuit branch of the first and of the second circuit branches of the second cross-coupled differential amplifier stage. A gate terminal of the field effect transistor connected as the load element and belonging to the second circuit branch of the first cross-coupled differential amplifier stage and to the first circuit branch of the second cross-coupled differential amplifier stage and that represents the output of the common-mode control circuit is connected both to the drain terminal of this transistor as well as to the gate terminals of the other two field effect transistors in the two current branches of the differential amplifier stage of the level-converting circuit. Gate terminals of the field effect transistors of the second channel type in the second circuit branch of the first and in the first circuit branch of the second cross-coupled differential amplifier stage are connected to a terminal that is connected to a reference voltage.

The advantage obtainable with the present invention is that the power source generating the quiescent current of the differential amplifier is also used for generating the auxiliary current components, whereby a modified drive of this current source merely has to be modified. This modification occurs outside of the actual circuit of the differential amplifier and is thus an external circuit measure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 is a fundamental circuit diagram of a differential amplifier of the present invention;

FIG. 2 is a voltage-time diagram for explaining the functioning of the differential amplifier of FIG. 1; and FIG. 3 is a circuit for generating a reference voltage required in FIG. 1.

DESCRIPTION OF THE PREFERRED EMBODIMENT

FIG. 1 shows an embodiment of a differential amplifier within the dot-dash block 1. A circuit node 2 is connected to a terminal 3 that is connected to a supply voltage $V_{DD}$, being connected thereto via two parallel circuit branches whereof one branch contains a series circuit of a load element L1 and of an n-channel field effect transistor T1 and the other branch contains a series circuit of a load element L2 and an n-channel field effect transistor T2. The circuit node 2 is also connected to a terminal 4 that is connected to a reference potential $V_{SS}$, being connected thereto via a further circuit branch that contains an n-channel field effect transistor T3 connected as power source. The load elements L1 and L2 are each composed of a p-channel field effect transistor whose drain terminal is connected to its gate terminal. The series circuit of a p-channel field effect transistor T4 and of an n-channel field effect transistor T5 lies between the terminals 3 and 4, whereby the gate of transistor T4 is connected to the gate of the field effect transistor that forms the load element L2. A further circuit branch that connects the terminals 3 and 4 to one another contains a series circuit of a p-channel field effect transistor T6 and an n-channel field effect transistor T7, whereby the gate of transistor T6 is connected to the gate of the field effect transistor that forms the load element L1. The gate of transistor T7 is connected both to the drain terminal of transistor T7 as well as to the gate of transistor T5. The junction of transistors T4 and T5 is conducted to the output A of the differential amplifier, whereas the gate terminals 5 and 6 of the transistors T2 and T1 respectively represent the positive and the negative amplifier inputs.

A circuit stage for setting the quiescent currents, that flow in the parallel circuit branches L1, T1 and L2, T2 when an input signal to be amplified has not appeared at the inputs 5 and 6 is connected to the gate terminal G of transistor T3. It is composed of two p-channel field effect transistor T8 and T9 connected parallel to one another that are connected in series with an n-channel field effect transistor T10 that is the outputside resistor of this stage. The series circuits of transistors T8 and T10 as well as of transistors T9 and T10 are connected between the terminals 3 and 4. The gate of transistor T10 is connected both to the drain terminal of transistor T10 as well as to the gate terminal G of transistor T3. When a reference voltage $U_{ref}$ is supplied to the gates of transistors T8 and T9 as shall be set forth in greater detail below, this reference voltage being only slightly below the threshold voltage $U_t$ of these transistors, then constant currents of identical size flow through transistors T8 and T9, these constant currents being combined into a sum current that flows through transistor T10. This allows a constant bias to drop off at the drain terminal of transistor T10, this constant bias being supplied via terminal G to the gate of transistor T3, as well as, setting this transistor to a fixed operating point in which it supplies a quiescent current $I_o$. $I_o$ corresponds to the sum of the identical quiescent currents $I_o/2$ that flow through the parallel circuit branches L1, T1 and L2, T2. The gates of transistors T1 and T2 are connected to bias $U_{G1}$ that is dimensioned such that transistors T1 and T2 are in their conductive state. When the structural designs of the transistors L2 and T4 coincide, then these form a current mirror wherein the current $I_o/2$ flows not only through L2 but also through the transistor T4. In an analogous fashion, the current mirror composed of L1 and T6, for identical structural design of these transistors, provides that a current $I_o/2$ flows not only L1 but also through transistor T6 and, thus transistor T7. The current mirror composed of the identically structured transistors T7 and T5, finally, provides that transistor T5 is traversed by $I_o/2$, as is transistor T7. Currents of identical size in the source-drain paths of transistors T4 and T5, however, mean that no current flows via the output A into a following load circuit that is indicated by a capacitor C.

This quiescent current mode corresponds to a relatively low power consumption. Only when an input signal to be amplified is received at the amplifier inputs 5 and 6 should the level control of the transistor T3 be boosted to such an extent that the differential amplifier 1 is able to supply an optimally undistorted and undelayed output signal to the load circuit connected to output A, this load circuit having a high impedance. To this end, a level-converting circuit PU is provided that is provided with a common-mode control circuit 7. The inputs of circuit PU are referenced 9 and 10, whereby input 9 is connected to the input 5 of the differential amplifier 1 and input 10 is connected to the input 6 thereof. The upper output 11 of circuit PU is connected to the gate of transistor T9; the lower output 12 thereof lies at the gate of transistor T8.

The function of the level-converting circuit PU is, first, in boosting the currents that flow through the transistors T8 or T9 when an input signal to be amplified is received at the terminals 5 and 6 such that a higher voltage drops off at the gate terminal G, this higher voltage then causing a significant current rise via transistor T3 in the parallel circuit branches L1, T1 and L2, T2 as well. Also the circuit PU also provides that the operating points of transistors T8 and T9 that define the quiescent currents in branches L1, T1 and L2, T2 and that are defined by $U_{ref}$ remain unaltered before and after the appearance of an input signal to the amplified. Also the level control transistors T8 and T9 occurs inversely for the appearance of an input signal, namely such that the arithmetic mean of the voltages at the gates of transistors T8 and T9 corresponds to the reference voltage $U_{ref}$ at every point in time.

The inverse control function of circuit PU for an input signal u1 is described in greater detail below: when it is assumed that the amplifier input 5 is supplied with, for example, a sinusoidal input signal u1 at point in time t1 that is superimposed on the bias $U_{G1}$, then a resultant signal u5 derives at terminal 5 whose time dependency is indicated in FIG. 2 with a solid line. Due to the functioning of the level-converting circuit PU, voltages that are referenced u11 and u12 in FIG. 2 are obtained at the outputs 11 and 12. In detail, u11 corresponds to a bias value $U_{A1}$ supplied to the gate of transistor T9 that is superimposed by the input signal u1 amplified in circuit PU, whereas u12 is composed of the bias value $U_{A1}$ and the amplified and inverted input signal u1 that is superimposed thereon. When $U_{A1}$ is slightly less than the threshold voltage $U_t$ of the transistors T8 and T9, as indicated in FIG. 2, then every negative sine half-wave u11 that falls below $U_t$ additionally level-controls the transistor T9 such than an increased current flows from terminal 3 via transistor T9 to terminal 4. As a result thereof, the voltage at the terminal G that is supplied to the gate of transistor T3 is increased, so that the current transistor T3 supplies to the branches L1, T1 and L2, T2 is also greatly boosted. Analogous thereto, every sine half-wave of u12 that falls below $U_t$ additionally level-controls the transistor T8 such that an increased current flows from terminal 3 via transistor T8 to terminal 4. This causes the voltage at the terminal G to be boosted, so that the current transistor T3 supplies to the branches L1, T1 and L2, T2 is also greatly boosted in these time spans. During the appearance of the input signal u1 which is to be amplified, i.e. within the time span t1 through t2, the current through the parallel circuit branches L1, T1 and L2, T2 controlled via T3 is greatly boosted, so that good driver properties of the differential amplifier are achieved. The higher power consumption of the amplifier caused as a result thereof, however, is limited to the time span in which the input signal u1 is present.

Since the circuit PU that converts the input level $U_{G1}$ into the output level $U_{A1}$ is driven from the amplifier inputs 5, 6, no control circuits as in the initially cited, known differential amplifier are present. The output signal appearing at output A that is taken at the junctions of the transistors L1 and T1 and of the transistors L2 and T2 and that is transmitted to the output A via the current mirrors L2, T4 as well as L1, T6 and T7, T5 is largely free of distortion. The signal transmission to the output proceeds such that every difference in size of the currents following through transistors L2 and L1 that is effected by the level control of transistors T2 and T1 with the input signal u1 yields a corresponding magnitude difference in the currents through transistors T4 and T5 that leads to an output current that can be taken at output A. In the differential amplifier of the present invention, the output signal responds very quickly to fluctuations of the input signal, so that input signals having steeply ascending and descending signal edges, for example square wave voltages, can also be transmitted to the output A largely free of distortion and with a great current boost.

A preferred exemplary embodiment of the level-converting circuit PU is shown in FIG. 1 inside the left-hand, dot-dash block. The circuit constructed as a differential amplifier stage specifically contains two parallel current branches arranged between a circuit node 8 and the terminal 3 ($V_{DD}$), the first current branch thereof has a p-channel field effect transistor T12 in series with an n-channel field effect transistor T11 and wherein the second current branch has a p-channel field effect transistor T14 in series with an n-channel field effect transistor T13. The circuit node 8 is connected to the terminal 4 ($V_{SS}$), being connected thereto via a circuit branch that contains the source-drain path of an n-channel field effect transistor T15. The input 9 corresponds to the gate terminal of transistor T13 and the input 10 corresponds to the gate terminal of transistor T11. The output 11 is connected to the junction of the transistors T14 and T13 and the output 12 is connected to the junction of the transistors T12 and T11. A circuit branch lying between the terminals 3 and 4 sets the gate voltage of transistor T15, this circuit branch containing the series circuit of a p-channel field effect transistor T22 and of an n-channel field effect transistor T23. The gate of transistor T22 is connected to the terminal 4, so that a defined current flows through this series circuit, this defined current being established by $V_{DD}$ and by the reference potential $V_{SS}$ adjacent to the gate of transistor T22. The gate of transistor T23 is connected to the drain terminal thereof. The voltage drop at the drain terminal is supplied to the gate of transistor T15 via a line 17. The transistors T12 and T14 whose structural designs are identical are operated in saturation, as is the transistor T15. Although the result is that the output level appearing at the outputs 11 and 12 that, of course, should correspond to $U_{A1}$ is undefined in this disadvantage can be eliminated by the magnitude, function of the common-mode control circuit when this is supplied with a voltage $U_{ref}$ as controlled variable that corresponds to the desired output level $U_{A1}$.

A preferred embodiment of the common-mode control circuit shown in FIG. 1 shall be set forth in greater detail below: it is accordingly composed of two cross-coupled differential amplifier stages. The first of these two contains two circuit branches connected parallel to one another, the first thereof having the series circuit of a p-channel field effect transistor L3 connected as a load element and of an n-channel field effect transistor T16, whereas the second circuit branch has the series circuit of a p-channel field effect transistor L4 connected as a load element and of an n-channel field effect transistor T17. These circuit branches are connected to a current source transistor T18 via a circuit node 13. The series circuit formed of the parallel circuit of the circuit branches L3, T16 and L4, T17 and of the current source transistor T18 is connected between the terminals 3 and 4. The current source transistor T18 receives its gate voltage from the drain terminal of the transistor T23. The second of the cross-coupled differential amplifier stages likewise contains two circuit branches connected parallel to one another whereof the first has the series circuit of an n-channel field effect transistor T19 and the transistor L4 connected as a load element in the second circuit branch of the first cross-coupled differential amplifier stage, whereas the second circuit branch has the series circuit of an n-channel field effect transistor T20 and the transistor L3 connected as a load element in the first circuit branch of the first cross-coupled differential amplifier stage. These circuit branches are connected to a current source transistor T21 via a circuit node 14. The series circuit formed of the parallel circuit of the circuit branches L4, T19 and L3, T20 and of the current source transistor T21 is thereby connected between the terminals 3 and 4. The gate terminal of transistor T21 is also connected to the drain terminal of transistor T23. The outputs 11 and 12 of the level-converting circuit PU are connected to the gate terminals of transistors T20 and T16, whereas the gate terminals of transistors T17 and T19 are connected to a terminal 16 to which the reference voltage $U_{ref}$ is supplied. The gate terminal of transistor L4 that is connected to the drain terminal of transistor L4 represents the output 15 of the control circuit. It is connected to the gate terminals of transistors T12 and T14 that are to be considered as load elements that are driven in parallel via the output 15 of the common-mode control circuit 7. When no input signal to be amplified has appeared at terminals 5 and 6 or 9 and 10, the load elements transistor T12 and T14 are driven such that an output level $U_{A1}$ can be taken at the outputs 11 and 12 of the level-converting circuit PU, this output level $U_{A1}$ corresponding to the value of the reference voltage $U_{ref}$ supplied at terminal 16. For the application of an input signal, the voltage u11 and u12 that proceed inversely relative to one another are obtained at the outputs 11 and 12, the voltage values of these voltages u11 and u12, however, exhibiting an arithmetic mean at every point in time that corresponds to $U_{A1}$. Every deviation of this mean value from $U_{A1}$ is immediately eliminated by the function of the control circuit.

FIG. 3 shows the example of a sub-circuit for deriving $U_{ref}$ from the supply voltage $V_{DD}$. It is composed of the series circuit of a p-channel field effect transistor T24 and an n-channel field effect transistor T25 that is connected between the terminals 3 and 4. The gate terminal of transistor T25 is connected to the terminal 3, whereas the gate terminal of transistor T24 is connected to its drain terminal. This drain terminal represents the output 18 of the sub-circuit at which the reference voltage $U_{ref}$ drops off insofar as the structural design of the transistor T24 is carried out such that the quotient of its channel width and its channel length corresponds to twice the corresponding quotient of one of the two transistors T8 or T9 that are fashioned identical to one another.

It lies within the frame work of the present invention to interchange the channel types of the field effect transistors with one another and to simultaneously replace the polarities of the supply voltages by the opposite polarities. The voltage values of $U_{A1}$ and $U_{G1}$ are thereby also to be interchanged with one another, this meaning in FIG. 2 that the voltage curves u5 and u6 take the place of the voltage curves u11 and u12 and vice versa. In this case, circuit PU converts a higher input level $U_{G1}$, i.e. the DC part of the input signal u1, to a lower output level $U_{A1}$. $U_{A1}$ then is slightly above the value of the threshold voltage $U_t$ of the transistors T8 and T9 that are of the n-channel type.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A differential amplifier having first and second parallel circuit branches each of which contains a load element (L1, L2) and a field effect transistor (T1, T2), respectively, and having a field effect transistor (T3) serving as a current source that is connected to both parallel circuit branches (L1, T1; L2, T2) via a first circuit node and whose gate terminal (G) is connected to a bias that defines the quiescent currents flowing in these circuit branches, comprising a circuit stage for setting the quiescent currents that is composed of two p-channel field effect transistors (T8, T9) that are connected in parallel and that are connected in series with a resistor located in an output side of the circuit stage; the resistor located in an output side of the circuit stage connected to a gate terminal (G) of the field effect transistor (T3) that serves as current source; a level-converting circuit having an input side connected to gate terminals (5, 6) of the field effect transistors (T1, T2) in the parallel circuit branches, that, further, converts the DC part of the input signal to a higher output level that falls slightly below the value of the threshold voltage of the two p-channel field effect transistors (T8, T9) that are connected parallel to one another, and that has its output side connected to gate terminals of the two p-channel field effect transistors (T8, T9); and the level-converting circuit having a common-mode control circuit to which a reference voltage corresponding to the higher output level is supplied as a controlled variable.

2. The differential amplifier according to claim 1, wherein the output-side resistor of the circuit stage for setting the quiescent currents is composed of a field effect transistor (T10) having a gate terminal connected to its drain terminal as well as to the gate terminal (G) of the field effect transistor (T3) that serves as the current source.

3. The differential amplifier according to claim 1, wherein the level-converting circuit is composed of a differential amplifier stage that contains two current branches connected parallel to one another, each of the current branches having a series circuit of two field effect transistors (T11, T12, T13, T14), respectively, of different channel types; wherein a first current source transistor (T15) of one channel type is connected to these two current branches via a second circuit node (8); wherein gate terminals of the field effect transistors (T11, T13) in the current branches that correspond to the channel type of the first current source transistor (T15) form the circuit inputs (9, 10) of the level-converting circuit; wherein the junctions between the latter field effect transistors (T11, T13) and the other two field effect transistors (T12, T14) in the current branches represents the circuit outputs (11, 12) of the level-converting circuit (PU); and wherein both these other two field effect transistors (T12, T14) as well as the current source transistor (T15) are operated in a saturation range.

4. The differential amplifier according to claim 3, wherein the common-mode control circuit is composed of first and second cross-coupled differential amplifier stages; wherein the first cross-coupled differential amplifier stage has two circuit branches connected parallel to one another, whereof the first has a series circuit of a field effect transistor (L3) of a first channel type that is connected as a load element and a field effect transistor (T16) of a second channel type and whereof the second has a series circuit of a further field effect transistor (L4) of the first channel type connected as a load element and a further field effect transistor (T17) of the second channel type; wherein these two circuit branches are connected to a second current source transistor (T18) via a third circuit node (13); wherein the second of the cross-coupled differential amplifier stages likewise has two circuit branches connected parallel to one another, whereby the first thereof has a series circuit of an additional field effect transistor (T19) of the second channel type and the field effect transistor (L4) connected as the load element in the second circuit branch of the first cross-coupled differential amplifier stage and the second circuit branch of the second cross-coupled differential amplifier stage contains the series circuit of a further, additional field effect transistor (T20) of the second channel type and the field effect transistor (L3) connected as the load element in the first circuit branch of the first cross-coupled differential amplifier stage; wherein the circuit branches (T19, L4, T20, L3) of the second cross-coupled amplifier stage are connected to a third current source transistor (T21) via a fourth circuit node (14); wherein the outputs (12,11) of the level-converting circuit are connected to gate terminals of the field effect transistors (T16, T20) of the second channel type in the first circuit branch of the first cross-coupled differential amplifier stage and in the second circuit branch of the second cross-coupled differential amplifier stage; wherein a gate terminal of the field effect transistor (L4) connected as the load element and belonging to the second circuit branch of the first cross-coupled differential amplifier stage and to the first circuit branch of the second cross-coupled differential amplifier stage and that represents the output (15) of the common-mode control circuit is connected both to the drain terminal of this transistor (L4) as well as to the gate terminals of the other two field effect transistors (T12, T14) in the two current branches of the differential amplifier stage of the level-converting circuit; and wherein gate terminals of the field effect transistors (T17, T19) of the second channel type in the second circuit branch of the first cross-coupled differential amplifier stage and in the first circuit branch of the second cross-coupled differential amplifier stage are connected to a terminal (16) that is connected to a reference voltage.

5. A differential amplifier having first and second parallel circuit branches each of which contains a load element (L1, L2) and a field effect transistor (T1, T2), respectively, and having a field effect transistor (T3) serving as a current source that is connected to both parallel circuit branches (L1, T1; L2, T2) via a first circuit node and whose gate terminal (G) is connected to a bias that defines the quiescent currents flowing in these circuit branches, comprising a circuit stage for setting the quiescent currents that is composed of two n-channel field effect transistors (T8, T9) connected in parallel to one another and that are connected in series with a resistor located in an output side of the circuit stage; the resistor located in the output side of the circuit stage connected to a gate terminal (G) of the field effect transistor (T3) that serves as current source; a level-converting circuit having an input side connected to gate terminals (5, 6) of the field effect transistors (T1, T2) in the parallel circuit branches, that, further, converts the DC part of the input signal to a lower output level that slightly exceeds the value of the threshold voltage of the two-n-channel field effect transistors (T8, T9) that are connected parallel to one another, and that has its output side connected to gate terminals of the two n-channel field effect transistors (T8, T9); and the level-converting circuit having a common-mode control circuit to which a reference voltage corresponding to the lower output level is supplied as a controlled variable.

6. The differential amplifier according to claim 5, wherein the output-side resistor of the circuit stage for setting the quiescent currents is composed of a field effect transistor (T10) having a gate terminal connected to its drain terminal as well as to the gate terminal (G) of the field effect transistor (T3) that serves as the current source.

7. The differential amplifier according to claim 5, wherein the level-converting circuit is composed of a differential amplifier stage that contains two current branches connected parallel to one another, each of the current branches having a series circuit of two field effect transistors (T11, T12, T13, T14), respectively, of different channel types; wherein a first current source transistor (T15) of one channel type is connected to these two current branches via a second circuit node (8); wherein gate terminals of the field effect transistors (T11, T13) in the current branches that correspond to the channel type of the first current source transistor (T15) form the circuit inputs (9, 10) of the level-converting circuit; wherein the junctions between the latter field effect transistors (T11, T13) and the other two field effect transistors (T12, T14) in the current branches represents the circuit outputs (11, 12) of the level-converting circuit (PU); and wherein both these other two field effect transistors (T12, T14) as well as the current source transistor (T15) are operated in a saturation range.

8. The differential amplifier according to claim 7, wherein the common-mode control circuit is composed of first and second cross-coupled differential amplifier stages; wherein the first cross-coupled differential amplifier stage has two circuit branches connected parallel to one another, whereof the first has a series circuit of a field effect transistor (L3) of a first channel type that is connected as a load element and a field effect transistor (T16) of a second channel type and whereof the second has a series circuit of a further field effect transistor (L4) of the first channel type connected as a load element and a further field effect transistor (T17) of a second channel type; wherein these two circuit branches are connected to a second current source transistor (T18) via a third circuit node (13); wherein the second of a cross-coupled differential amplifier stages likewise has two circuit branches connected parallel to one another, whereby the first thereof has a series circuit of an additional field effect transistor (T19) of the second channel type and the field effect transistor (L4) connected as the load element in the second circuit branch of the first cross-coupled differential amplifier stage and the second circuit branch of the second cross-coupled differential amplifier stage contains the series circuit of a further, additional field effect transistor (T20) of the second channel type and the field effect transistor (L3) connected as the load element in the first circuit branch of the first cross-coupled differential amplifier stage; wherein the circuit branches (T19, L4, T20, L3) of the second cross-coupled amplifier stage are connected to a third current source transistor (T21) via a fourth circuit node (14); wherein the outputs (12,11) of the level-converting circuit are connected to gate terminals of the field effect transistors (T16, T20) of the second channel type in the first circuit branch of the first cross-coupled differential amplifier stage and in the second circuit branch of the second cross-coupled differential amplifier stage; wherein a gate terminal of the field effect transistor (L4) connected as the load element and belonging to the second circuit branch of the first cross-coupled differential amplifier stage and to the first circuit branch of the second cross-coupled differential amplifier stage and that represents the output (15) of the common-mode control circuit is connected both to the drain terminal of this transistor (L4) as well as to the gate terminals of the other two field effect transistors (T12, T14) in the two current branches of the differential amplifier stage of the level-converting circuit; and wherein gate terminals of the field effect transistors (T17, T19) of the second channel type in the second circuit branch of the first cross-coupled differential amplifier stage and in the first circuit branch of the second cross-coupled differential amplifier stage are connected to a terminal (16) that is connected to a reference voltage.

9. A differential amplifier having first and second parallel circuit branches each of which contains a load element (L1, L2), the load elements L1 and L2 being p-channel field effect transistors, and an n-channel field effect transistor (T1, T2), respectively, and having an n-channel field effect transistor (T3) serving as a current source that is connected to both parallel circuit branches (L1, T1; L2, T2) via a first circuit node and whose gate terminal (G) is connected to a bias that defines the quiescent currents flowing in these circuit branches, comprising:

a circuit stage for setting the quiescent currents that is composed of two p-channel field effect transistors (T8, T9) that are connected in parallel and that are connected in series with a resistor located in an output side of the circuit stage; the resistor located in the output side of the circuit stage connected to a gate terminal (G) of the field effect transistor (T3) that serves as current source; a level-converting circuit having an input side connected to gate terminals (5, 6) of the field effect transistors (T1, T2) in the parallel circuit branches, that, further, converts the DC part of the input signal to a higher output level that falls slightly below the value of the threshold voltage of the two p-channel field effect transistors (T8, T9) that are connected parallel to one another, and that has its output side connected to gate terminals of the two p-channel field effect transistors (T8, T9); and the level-converting circuit having a common-mode control circuit to which a reference voltage corresponding to the higher output level is supplied as a controlled variable;

the output-side resistor of the circuit stage for setting the quiescent currents being composed of an n-channel field effect transistor (T10) having a gate terminal connected to its drain terminal as well as to the gate terminal (G) of the field effect transistor (T3) that serves as the current source;

the level-converting circuit being composed of a differential amplifier stage that contains two current branches connected parallel to one another, each of the current branches having a series circuit of two field effect transistors (T11, T12, T13, T14), respectively, transistors T11 and T13 being n-channel field effect transistors and transistors T12 and T14 being p-channel field effect transistors, wherein a first n-channel current source transistor (T15) is connected to these two current branches via a second circuit node (8); wherein gate terminals of the field effect transistors (T11, T13) in the current branches that correspond to the channel type of the first current source transistor (T15) form the circuit inputs (9, 10) of the level-converting circuit; wherein the junctions between the latter field effect transistors (T11, T13) and the other two field effect transistors (T12, T14) in the current branches represents the circuit outputs (11, 12) of the level-converting circuit (PU); and wherein both these other two field effect transistors (T12, T14) as well as the current source transistor (T15) are operated in a saturation range; and the common-mode control circuit being composed of first and second cross-coupled differential amplifier stages; wherein the first cross-coupled differential amplifier stage has two circuit branches connected parallel to one another, whereof the first has a series circuit of a p-channel field effect transistor (L3) that is connected as a load element and an n-channel field effect transistor (T16) and whereof the second has a series circuit of a further p-channel field effect transistor (L4) connected as a load element and a further n-channel field effect transistor (T17) wherein these two circuit branches are connected to a second current source transistor (T18) via a third circuit node (13); wherein the second of the cross-coupled differential amplifier stages likewise has two circuit branches connected parallel to one another, whereby the first thereof has a series circuit of an additional n-channel field effect transistor (T19) and the field effect transistor (L4) connected as the load element in the second circuit branch of the first cross-coupled differential amplifier stage and the second circuit branch of the second cross-coupled differential amplifier stage contains the series circuit of a further, additional n-channel field effect transistor (T20) and the field effect transistor (L3) connected as the load element in the first circuit branch of the first cross-coupled differential amplifier stage; wherein the circuit branches (T19, L4, T20, L3) of the second cross-coupled amplifier stage are connected to a third current source transistor (T21) via a fourth circuit node (14); wherein the outputs (12, 11) of the level-converting circuit are connected to gate terminals of the field effect transistors (T16, T20) in the first circuit branch of the first cross-coupled differential amplifier stage and in the second circuit branch of the second cross-coupled differential amplifier stage; wherein a gate terminal of the field effect transistor (L4) connected as the load element and belonging to the second circuit branch of the first cross-coupled differential amplifier stage and to the first circuit branch of the second cross-coupled differential amplifier stage and that represents the output (15) of the common-mode control circuit is connected both to the drain terminal of this transistor (L4) as well as to the gate terminals of the other two field effect transistors (T12, T14) in the two current branches of the differential amplifier stage of the level-converting circuit; and wherein gate terminals of the field effect transistors (T17, T19) in the second circuit branch of the first cross-coupled differential amplifier stage and in the first circuit branch of the second cross-coupled differential amplifier stage are connected to a terminal (16) that is connected to a reference voltage.

10. A differential amplifier having first and second parallel circuit branches each of which contains a load element (L1, L2), the load elements L1 and L2 being n-channel field effect transistors, and a p-channel field effect transistor (T1, T2), respectively, and having a p-channel field effect transistor (T3) serving as a current source that is connected to both parallel circuit branches (L1, T1; L2, T2) via a first circuit node and whose gate terminal (G) is connected to a bias that defines the quiescent currents flowing in these circuit branches, comprising:

a circuit stage for setting the quiescent currents that is composed of two n-channel field effect transistors (T8, T9) that are connected in parallel and that are connected in series with a resistor located in an output side of the circuit stage; the resistor located in the output side of the circuit stage connected to a gate terminal (G) of the field effect transistor (T3) that serves as current source; a level-converting circuit having an input side connected to gate terminals (5, 6) of the field effect transistors (T1, T2) in the parallel circuit branches, that, further, converts the DC part of the input signal to a lower output level that slightly exceeds the value of the threshold voltage of the two n-channel field effect transistors (T8, T9) that are connected parallel to one another, and that has its output side connected to gate terminals of the two n-channel field effect transistors (T8, T9); and the level-converting circuit having a common-mode control circuit to which a reference voltage corresponding to the lower output level is supplied as a controlled variable;

the output-side resistor of the circuit stage for setting the quiescent currents being composed of a p-channel field effect transistor (T10) having a gate terminal connected to its drain terminal as well as to the gate terminal (G) of the field effect transistor (T3) that serves as the current source;

the level-converting circuit being composed of a differential amplifier stage that contains two current branches connected parallel to one another, each of the current branches having series circuit of two field effect transistors (T11, T12, T13, T14), respectively, transistors T11 and T13 being p-channel field effect transistors and transistors T12 and T14 being n-channel field effect transistors, wherein a first n-channel current source transistor (T15) is connected to these two current branches via a second circuit node (8); wherein gate terminals of the field effect transistors (T11, T13) in the current branches that correspond to the channel type of the first current source transistor (T15) form the circuit inputs (9, 10) of the level-converting circuit; wherein the junctions between the latter field effect transistors (T11, T13) and the other two field effect transistors (T12, T14) in the current branches represents the circuit outputs (11, 12) of the level-converting circuit (PU); and wherein both these other two field effect transistors (T12, T14) as well as the current source transistor (T15) are operated in a saturation range; and the common-mode control circuit being composed of first and second cross-coupled differential amplifier stages; wherein the first cross-coupled differential amplifier stage has two circuit branches connected parallel to one another, whereof the first has a series circuit of an n-channel field effect transistor (L3) that is connected as a load element and a p-channel field effect transistor (T16) and whereof the second has a series circuit of a further n-channel field effect transistor (L4) connected as a load element and a further p-channel field effect transistor (T17) wherein these two circuit branches are connected to a second current source transistor (T18) via a third circuit node (13); wherein the second of the cross-coupled differential amplifier stages likewise has two circuit branches connected parallel to one another, whereby the first thereof has a series circuit of an additional p-channel field effect transistor (T19) and the field effect transistor (L4) connected as the load element in the second circuit branch of the first cross-coupled differential amplifier stage and the second circuit branch of the second cross-coupled differential amplifier stage contains the series circuit of a further, additional p-channel field effect transistor (T20) and the field effect transistor (L3) connected as the load element in the first circuit branch of the first cross-coupled differential amplifier stage; wherein the circuit branches (T19, L4, T20, L3) of the second cross-coupled amplifier stage are connected to a third current source transistor (T21) via a fourth circuit node (14); wherein the outputs (12, 11) of the level-converting circuit are connected to gate terminals of the field effect transistors (T16, T20) in the first circuit branch of the first cross-coupled differential amplifier stage and in the second circuit branch of the second cross-coupled differential amplifier stage; wherein a gate terminal of the field effect transistor (L4) connected as the load element and belonging to the second circuit branch of the first cross-coupled differential amplifier stage and to the first circuit branch of the second cross-coupled differential amplifier stage and that represents the output (15) of the common-mode control circuit is connected both to the drain terminal of this transistor (L4) as well as to the gate terminals of the other two field effect transistors (T12, T14) in the two current branches of the differential amplifier stage of the level-converting circuit; and wherein gate terminals of the field effect transistors (T17, T19) in the second circuit branch of the first cross-coupled differential amplifier stage and in the first circuit branch of the second cross-coupled differential amplifier stage are connected to a terminal (16) that is connected to a reference voltage.

* * * * *